(12) United States Patent
Park et al.

(10) Patent No.: US 10,522,107 B2
(45) Date of Patent: Dec. 31, 2019

(54) DATA DRIVER AND METHOD OF DRIVING THE DATA DRIVER

(71) Applicant: SAMSUNG DISPLAY CO., LTD., Yongin-si, Gyeonggi-do (KR)

(72) Inventors: Su Hyeong Park, Yongin-si (KR); Ho Yong Jung, Yongin-si (KR); Hoe Seok Na, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 840 days.

(21) Appl. No.: 14/996,283

(22) Filed: Jan. 15, 2016

(65) Prior Publication Data
US 2016/0308513 A1    Oct. 20, 2016

(30) Foreign Application Priority Data

Apr. 15, 2015 (KR) ........................ 10-2015-0053226

(51) Int. Cl.
*G09G 5/00* (2006.01)
*G11C 19/28* (2006.01)

(52) U.S. Cl.
CPC ............ *G09G 5/003* (2013.01); *G11C 19/28* (2013.01); *G09G 2300/0426* (2013.01); *G09G 2310/0267* (2013.01); *G09G 2310/0286* (2013.01); *G09G 2310/0291* (2013.01); *G09G 2310/08* (2013.01); *G09G 2330/021* (2013.01)

(58) Field of Classification Search
CPC ... G09G 2300/0426; G09G 2310/0267; G09G 2310/0286; G09G 2310/0291; G09G 2310/08; G09G 2330/021; G09G 5/003; G11C 19/28
See application file for complete search history.

(56) References Cited

U.S. PATENT DOCUMENTS

| 7,518,588 | B2 | 4/2009 | Lin |
| 7,956,854 | B2 | 6/2011 | Hashimoto |
| 8,310,507 | B2 | 11/2012 | Hiratsuka |
| 8,466,908 | B2 | 6/2013 | Yen |
| 8,681,186 | B2 | 3/2014 | Park |

(Continued)

FOREIGN PATENT DOCUMENTS

| JP | 2012058692 | 3/2012 |
| KR | 1020110022268 | 3/2011 |

(Continued)

*Primary Examiner* — Kenneth Bukowski
(74) *Attorney, Agent, or Firm* — F. Chau Associates, LLC

(57) ABSTRACT

A data driver includes shift registers, sampling latches, holding latches, and a data sensing unit. The shift registers generate sampling pulses by shifting a source start pulse in response to a source sampling clock. Each of the sampling latches receives current data and stores the current data in response to each of the sampling pulses. Each of the holding latches receives the current data stored in each of the sampling latches, and stores the received current data in response to a source output enable signal. The data sensing unit receives the current data corresponding to an i-th sampling latch of the sampling latches or an i-th holding latch of the holding latches (i is a positive integer) and previous data stored in the i-th sampling latch or the i-th holding latch, compares the current data with the previous data, and generates control data based on the comparison result.

18 Claims, 10 Drawing Sheets

(56) References Cited

U.S. PATENT DOCUMENTS

| | | | |
|---|---|---|---|
| 2007/0120780 A1* | 5/2007 | Park | G09G 3/3291 345/76 |
| 2009/0027377 A1* | 1/2009 | Kwon | G09G 3/3233 345/214 |
| 2013/0257486 A1 | 10/2013 | Hwang et al. | |
| 2013/0257917 A1* | 10/2013 | Peng | G09G 3/20 345/690 |
| 2013/0307838 A1 | 11/2013 | Kim et al. | |
| 2014/0160104 A1 | 6/2014 | Lin et al. | |
| 2015/0103065 A1* | 4/2015 | Kim | G09G 3/3614 345/212 |
| 2015/0123961 A1 | 5/2015 | Park et al. | |

FOREIGN PATENT DOCUMENTS

| | | |
|---|---|---|
| KR | 1020130051303 | 5/2013 |
| KR | 1020130109784 | 10/2013 |
| KR | 1020150051462 | 5/2015 |
| KR | 1020160020650 | 2/2016 |
| KR | 1020160032772 | 3/2016 |

\* cited by examiner

DATA DRIVER AND METHOD OF DRIVING THE DATA DRIVER

CROSS-REFERENCE TO RELATED APPLICATION

This application claims priority under 35 U.S.C. § 119 to Korean Patent Application No. 10-2015-0053226, filed on Apr. 15, 2015, in the Korean Intellectual Property Office, the disclosure of which is incorporated by reference herein in its entirety.

TECHNICAL FIELD

An exemplary embodiment of the present invention relates to a data driver and a method of driving the data driver, and more particularly, to a data driver capable of minimizing power consumption and a method of driving the data driver.

DISCUSSION OF THE RELATED ART

A liquid crystal display device (LCD), an organic light emitting display device (OLED), and a plasma display panel (PDP) are examples of display devices.

A display device may include a data driver for supplying data signals to data lines, a scan driver for supplying scan signals to scan lines, and a pixel unit including pixels positioned in regions divided by the scan lines and the data lines.

The data driver may depend on a bias voltage of an operational amplifier used by the data driver to transmit the data signal. For example, the power consumption may be increased as the bias voltage is increased to quickly charge a pixel. On the other hand, the power consumption may be reduced if the bias voltage is reduced, but the charging time of a pixel may increase.

A charge sharing technology may be used to reduce power consumption by controlling switches respectively connected to the data lines. However, when the charge sharing technology is used, power consumption may increase.

SUMMARY

According to an exemplary embodiment of the present invention, a data driver is provided. The data driver includes a plurality of shift registers, a plurality of sampling latches, a plurality of holding latches, and a data sensing unit. The plurality of shift registers is configured to sequentially generate a plurality of sampling pulses by shifting a source start pulse in response to a source sampling clock. Each of the plurality of sampling latches is configured to receive current data and sequentially store the current data in response to each of the sampling pulses. Each of the plurality of holding latches is configured to receive the current data stored in each of the sampling latches, and to store the received current data in response to a source output enable signal. The data sensing unit is configured to receive the current data corresponding to an i-th sampling latch of the sampling latches or an i-th holding latch of the holding latches (i is a positive integer) and previous data stored in the i-th sampling latch or the i-th holding latch, to compare the current data with the previous data, and to generate control data based on the comparison result.

The data driver may further include a plurality of multiplexer switches. Each of the multiplexer switches may be connected to each of the sampling latches and may be driven in synchronization with a rising edge of each of the sampling pulses.

An i-th multiplexer switch of the multiplexer switches may supply the previous data stored in the i-th sampling latch or the i-th holding latch in synchronization with a rising edge of an i-th sampling pulse of the sampling pulses to the data sensing unit.

Each of the sampling latches may be driven in synchronization with a falling edge of each of the sampling pulses.

The data sensing unit may compare the current data with the previous data by using at least one bit including the most significant bit (MSB) of the current data and the previous data.

The data driver may further include first storage latches and second storage latches. The first storage latches may be configured to sequentially store the control data in synchronization with the falling edges of the sampling pulses. The second storage latches may be configured to receive the control data stored in the first storage latches, and to store the received control data in response to the source output enable signal.

The data driver may further include a bias voltage generator configured to generate a plurality of bias voltages.

The data driver may further include at least one digital-to-analog converter (DAC), an operational amplifier, and a voltage selecting unit. The at least one DAC may be configured to generate a data signal by using data stored in the holding latches. The operational amplifier may be positioned between the DAC and one of a plurality of data lines. The operational amplifier may be configured to transmit the data signal to the one of the plurality of data lines. The voltage selecting unit may be configured to supply one of the plurality of bias voltages to the operational amplifier in response to the control data.

The DAC, the operational amplifier, and the voltage selecting unit may correspond to each of the data lines.

The data driver may further include a plurality of charge sharing switches and a switch controller. Each of the plurality of charge sharing switches may be connected between each of the data lines and a capacitor. The switch controller may be configured to control to turn-on and turn-off each of the charge sharing switches in response to the control data.

The shift registers may include a first shift register and a second shift register. The first shift register may include a first flip-flop and a first AND gate. The first flip-flop may be configured to shift a source start pulse in response to a source sampling pulse. The first AND gate may be configured to perform a first logic AND operation on an output signal of the first flip-flop and the source sampling pulse, and to output a waveform obtained by the first logic AND operation as a first sampling pulse of the sampling pulses. The second shift register may include a second flip-flop and a second AND gate. The second flip-flop may be configured to shift the output signal of the first flip-flop in response to the source sampling pulse. The second AND gate may be configured to perform a second logic AND operation on an output signal of the second flip-flop and the source sampling pulse, and to output a waveform obtained by the second logic AND operation as a second sampling pulse of the sampling pulses.

The first shift register may further include a buffer configured to transmit the source sampling pulse to the first AND gate.

According to an exemplary embodiment of the present invention, a method of driving a data driver is provided. The method includes generating a plurality of sampling pulses by shifting a source start pulse in response to a source sampling clock, storing current data in each of a plurality of sampling latches in response to each of the sampling pulses, storing the current data stored in the sampling latches to each of a plurality of holding latches in response to a source output enable signal, receiving the current data corresponding to an i-th sampling latch of the sampling latches or an i-th holding latch of the holding latches (i is a positive integer) and previous data stored in the i-th sampling latch or the i-th holding latch, and comparing the previous data with the current data to generate control data.

Each of the sampling latches may be driven in synchronization with a falling edge of each of the sampling pulses.

The method may further include generating an analog data signal by using data stored in each of the holding latches and controlling a bias voltage to be supplied to an operational amplifier. The operational amplifier may be configured to transmit the analog data signal to one of a plurality of data lines in response to the control data.

The method may further include controlling turn-on and turn-off charge sharing switches positioned between each of the data lines and a capacitor in response to the control data.

According to an exemplary embodiment of the present invention, a display device is provided. The display device includes a display panel and a data driver. The display panel displays an image. The data driver supplies a plurality of data signals to the display panel through a plurality of data lines. The data driver includes a sensing unit, a sampling latch unit, and a holding latch unit. The sensing unit compares current image data and previous image data stored in the sampling latch unit or the holding latch unit, and generates control data based on the comparison result. A first data line of the plurality of data lines is connected to a first terminal of a first switch. A second terminal of the first switch is connected to a first capacitor. A second data line of the plurality of data lines is connected to a first terminal of a second switch. A second terminal of the second switch is connected to the first capacitor.

The data driver may further include a switch controller controlling to turn-on or turn-off each of the first switch and the second switch based on the control data.

The switch controller may turn-off each of the first switch and the second switch when the previous image data and the current image data is the same as each other or when a difference between the previous image data and the current image data is smaller than a reference value.

The switch controller may turn-on each of the first switch and the second switch when the difference between the previous image data and the current image data is larger than the reference value.

BRIEF DESCRIPTION OF THE DRAWINGS

Exemplary embodiments of the present invention will be more clearly understood from the detailed description taken in conjunction with the accompanied drawings in which.

DETAILED DESCRIPTION OF THE EMBODIMENTS

Figure 1:
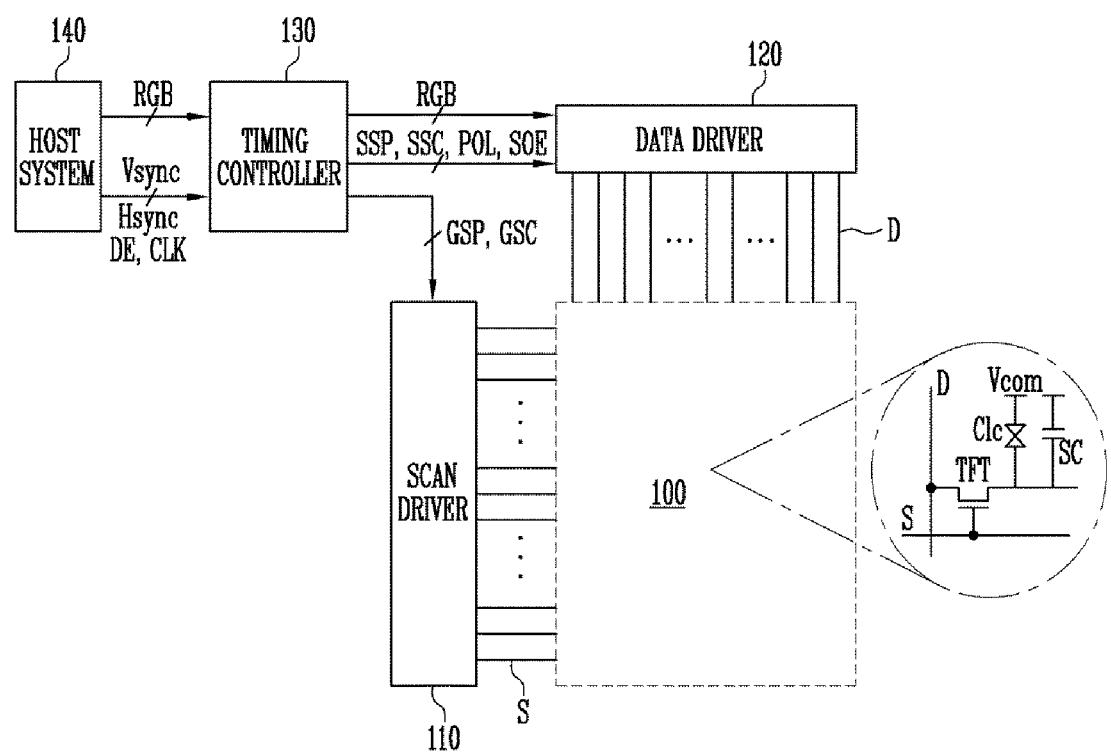
FIG. 1 is a block diagram illustrating a display device according to an exemplary embodiment of the present invention.

Exemplary embodiments of the present invention will now be described more fully hereinafter with reference to the accompanying drawings. The present invention, however, may be embodied in various forms and should not be construed as limited to the exemplary embodiments set forth herein.

In the drawings, dimensions may be exaggerated for clarity of illustration. It will be understood that when an element is referred to as being "between" two elements, it can be the only element between the two elements, or one or more intervening elements may also be present. Like reference numerals may refer to like elements throughout the written description and drawings. All the elements throughout the written description and drawings may be circuits.

FIG. 1 is a block diagram illustrating a display device according to an exemplary embodiment of the present invention. For ease of description, the display device of FIG. 1 is a liquid crystal display device (LCD). However, the present invention is not limited thereto. For example, the display device may be an organic light-emitting diode (OLED) or a plasma display panel (PDP) device.

Referring to FIG. 1, the display device according to an exemplary embodiment of the present invention includes a pixel unit 100, a scan driver 110, a data driver 120, a timing controller 130, and a host system 140.

The pixel unit 100 may be a valid display unit of a liquid crystal panel that displays an image. The liquid crystal panel includes a thin film transistor (TFT) substrate and a color filter substrate. A liquid crystal layer is formed between the TFT substrate and the color filter substrate. Data lines D and scan lines S are formed on the TFT substrate, and a plurality of pixels are arranged in regions divided by the scan lines S and the data lines D.

Each of the pixels includes a TFT that transmits a data signal supplied via a data line D to a liquid crystal capacitor Clc in response to a scan signal transmitted through a scan line S. For this purpose, a gate electrode of the TFT is connected to the scan line S, and a first electrode of the TFT is connected to the data line D. A second electrode of the TFT is connected to the liquid crystal capacitor Clc and a storage capacitor SC.

Here, the first electrode may be one of a source electrode and a drain electrode of the TFT, and the second electrode may be another one of the source electrode and the drain electrode of the TFT. For example, when the first electrode is the source electrode, the second electrode may be the drain electrode or vice versa. In addition, the liquid crystal capacitor Clc may be equivalent to liquid crystal between a pixel electrode and a common electrode that are formed on the TFT substrate. The storage capacitor SC maintains a voltage of the data signal transmitted to the pixel electrode for a certain time until a next data signal is supplied.

A black matrix and a color filter are formed on the color filter substrate.

The common electrode is formed on the color filter substrate in a vertical electric field driving mode such as a twisted nematic (TN) mode, a vertical alignment (VA) mode, or the like. In an exemplary embodiment of the present invention, the common electrode is formed on the TFT substrate with the pixel electrode in a horizontal electric field driving mode such as an in plane switching (IPS) mode, a fringe field switching (FFS) mode, or the like. A common voltage Vcom is supplied to the common electrode. In addition, a liquid crystal mode of the liquid crystal panel is not limited to the above-described TN mode, VA mode, IPS mode, and FFS mode.

The data driver 120 converts image data RGB input from the timing controller 130 into gamma compensation voltages of positive or negative polarity, and generates analog data voltages of positive or negative polarity. The analog data voltages of positive or negative polarity generated by the data driver 120 are supplied to the data lines D as data signals.

In addition, the data driver 120 controls a bias voltage supplied to an operational amplifier and operations of charge sharing switches in response to image data RGB, which will be described in detail later.

The scan driver 110 supplies scan signals to the scan lines S. For example, the scan driver 110 may sequentially supply the scan signals to the scan lines S. When the scan signals are sequentially supplied to the scan lines S, pixels are selected by a unit of horizontal line, and the pixels selected by the scan signals receive the data signals.

The timing controller 130 supplies a gate control signal to the scan driver 110 based on timing signals such as the image data RGB, a vertical synchronizing signal Vsync, a horizontal synchronizing signal Hsync, a data enable signal DE, and a clock signal CLK that are output from the host system 140. The timing controller 130 supplies a data control signal to the data driver 120. In addition, the timing controller 130 rearranges the image data RGB and supplies the rearranged image data RGB to the data driver 120.

The gate control signal includes a gate start pulse GSP and at least one gate shift clock GSC. The gate start pulse GSP controls timing of a first scan signal. The gate shift clock GSC may be at least one clock signal for shifting the gate start pulse GSP.

The data control signal includes a source start pulse SSP, a source sampling clock SSC, a source output enable signal SOE, and a polarity control signal POL. The source start pulse SSP controls a data sampling start point of the data driver 120. The source sampling clock SSC controls a sampling operation of the data driver 120 based on a falling edge of the source sampling clock SSC. The source output enable signal SOE controls output timing of the data driver 120. The polarity control signal POL controls polarity of a data signal output from the data driver 120.

The host system 140 supplies the image data RGB to the timing controller 130 through an interface such as a low voltage differential signaling (LVDS), a transition minimized differential signaling (TMDS), or the like. In addition, the host system 140 supplies the timing signals Vsync, Hsync, DE, and CLK to the timing controller 130.

Figure 2A:
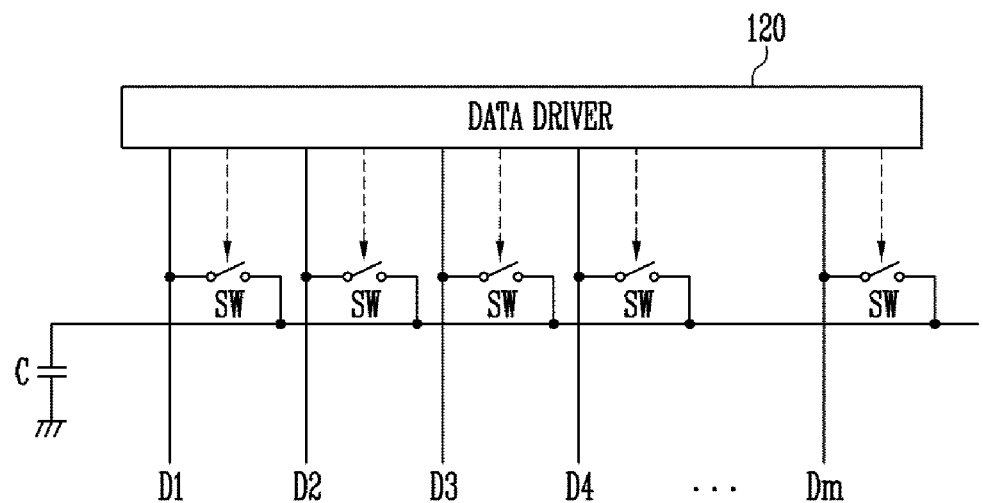
FIGS. 2A and 2B are views illustrating switches for charge sharing according to an exemplary embodiment of the present invention.
Figure 2B:
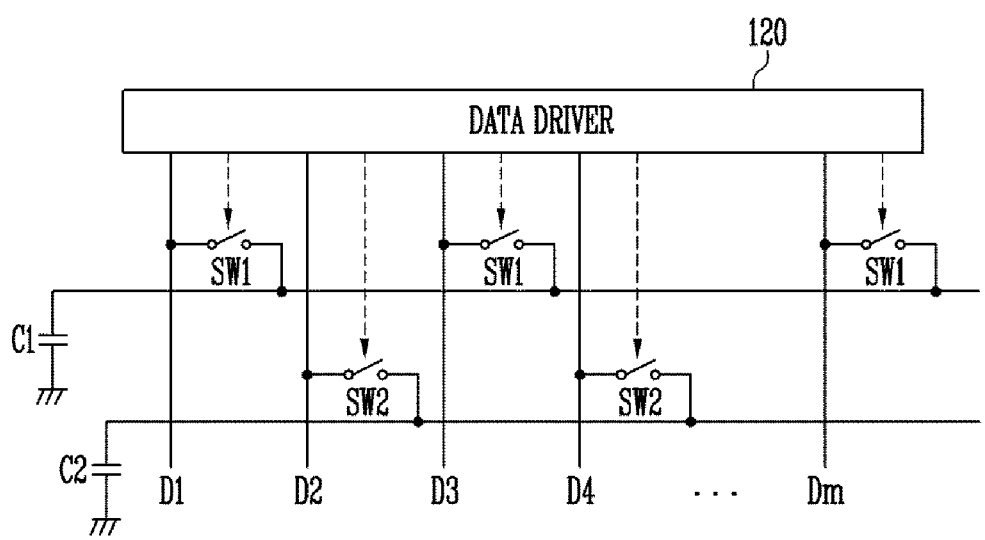

FIGS. 2A and 2B are views illustrating switches for charge sharing according to an exemplary embodiment of the present invention.

Referring to FIG. 2A, each switch SW (e.g., a charge sharing switch) is connected between each of data lines D1 to Dm and a capacitor C.

The capacitor C is positioned inside or outside the data driver 120, and stores a predetermined voltage. For example, the capacitor C stores an approximately median voltage Vm in a voltage range of data signals supplied by the data driver 120.

The switches SW are selectively turned on or off by a unit of channel in response to control of the data driver 120. For example, each of the plurality of data lines D1 to Dm may correspond to each of a plurality of channels. When a switch SW is turned on, an approximately median voltage Vm in the voltage range of the data signals is supplied to a data line D of a corresponding channel. When the switching SW is turned off, the data line D of the corresponding channel maintains a voltage of a previously supplied data signal. Thus, the data driver 120 selectively controls the switches SW so that power consumption may be minimized, which will be described in detail later.

In addition, when data signals of the same polarity (for example, positive polarity or negative polarity) are supplied to the data lines D1 to Dm, respectively, the data lines D1 to Dm that receives the data signals of the same polarity may be connected to a single capacitor C through one of the switches SW.

In addition, referring to FIG. 2B, when data signals of different polarities are supplied to the data lines D1 to Dm, respectively (e.g., inversion driving), the data lines D1 to Dm that receive the data signals of the different polarities are connected to different capacitors C1 and C2 through a corresponding one of first switches SW1 and second switches SW2.

For example, the odd data lines D1, D3, . . . are respectively connected to first switches SW1 which are connected to a first capacitor C1, and the even data lines D2, D4, . . . are respectively connected to second switches SW2 which are connected to a second capacitor C2.

The first switches SW1 and the second switches SW2 are selectively turned on or off in response to the control of the data driver 120. When the first switches SW1 are turned on, a median voltage of the positive polarity (or negative polarity) data signals is supplied to each of the data lines (e.g., the odd data lines D1, D2, . . . ) connected to the first switches SW1. When the second switches SW2 are turned on, a median voltages of the negative polarity (or positive polarity) data signals is supplied to each of the data lines (e.g., the even data lines D0, D2, . . . ) connected to the second switches SW2.

According to an exemplary embodiment of the present invention, each of charge sharing switches SW (e.g., SW1 or SW2) is included in each channel, and each of the switches SW (e.g., SW1 or SW2) is controlled using the data driver 120 by a unit of channel, and thus power consumption of a data driver 120 is reduced.

Figure 3:
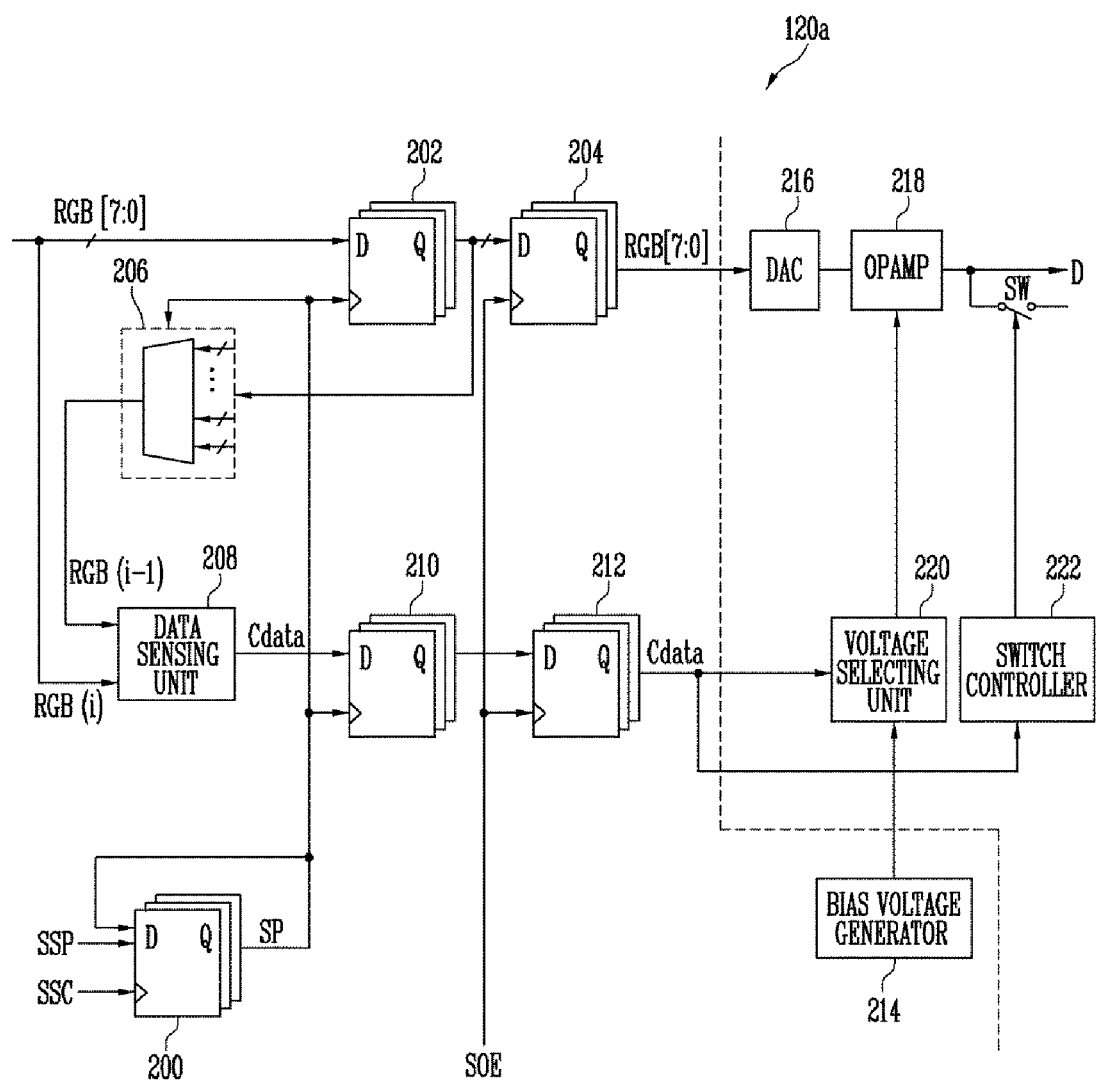
FIG. 3 is a block diagram illustrating a data driver of FIG. 1 according to an exemplary embodiment of the present invention.

FIG. 3 is a block diagram illustrating a data driver 120a of FIG. 1 according to an exemplary embodiment of the present invention.

Referring to FIG. 3, the data driver 120a according to an exemplary embodiment of the present invention includes a shift register unit 200, a sampling latch unit 202, a holding latch unit 204, a first storage unit 210, a second storage unit 212, a multiplexer unit 206, a data sensing unit 208, and a bias voltage generator 214.

In an exemplary embodiment of the present invention, the data driver 120a includes a digital analog converter (DAC) 216, an operational amplifier 218, a voltage selecting unit 220, and a switch controller 222 that are disposed in each channel.

The shift register unit 200 receives the source sampling clock SSC and the source start pulse SSP from the timing controller 130. The shift register unit 200 that receives the source sampling clock SSC sequentially generates a plurality of sampling pulses SP (e.g., SP1 to SPj of FIG. 4) by shifting the source start pulse SSP in response to the source sampling clock SSC (e.g., every single period of the source sampling clock SSC). For this purpose, the shift register unit 200 includes a plurality of shift registers.

The sampling latch unit 202 sequentially stores the image data RGB in response to the sampling pulses SP sequentially supplied by the shift register unit 200. For example, the sampling latch unit 202 may store the image data RGB corresponding to, e.g., six channels in response to the sampling pulses SP. For this purpose, the sampling latch unit 202 includes at least one sampling latch (e.g., SAR1 to SARj of FIG. 4) for storing the image data RGB corresponding to at least one channel of the plurality of channels.

The holding latch unit 204 receives the image data RGB from the sampling latch unit 202 and stores the received image data RGB in response to the source output enable signal SOE. The holding latch unit 204 supplies the image data RGB stored therein to the DAC 216 positioned in each channel in response to the source output enable signal SOE. For this purpose, the holding latch unit 204 includes at least one holding latch (e.g., HOR1 to HORj of FIG. 4) for storing the image data RGB corresponding to at least one channel of the plurality of channels.

The multiplexer unit 206 supplies previous image data RGBi-1 provided from the sampling latch to the data sensing unit 208 in response to the sampling pulses SP.

The data sensing unit 208 compares the previous image data RGBi-1 supplied by the multiplexer unit 206 with current image data RGBi supplied by the timing controller 130, and generates control data Cdata based on a comparison result. Here, the previous image data RGBi-1 may be understood to mean data corresponding to a previous horizontal line, and the current image data RGBi may be data corresponding to a current horizontal line.

In addition, the data sensing unit 208 compares the previous image data RGBi-1 with the current image data RGBi by using at least one bit including the most significant bit (MSB). For example, when the MSB is used to be compared, the data sensing unit 208 may generate the control data Cdata corresponding to "1" when the MSB changes (e.g., when the MSB of the previous image data RGBi-1 is different from the MSB of the current image data RGBi), and may generate the control data Cdata corresponding to "0" when the MSB does not change (e.g., when the MSB of the previous image data RGBi-1 is the same as the MSB of the current image data RGBi). For example, when two bits including the MSB are used to be compared, the data sensing unit 208 may generate the control data Cdata of "00", "01", "10", and "11" according to a degree of change in the two bits between the previous image data RGBi-1 and the current image data RGBi.

The first storage unit 210 sequentially stores the control data Cdata in response to the sampling pulses SP. For example, the first storage unit 210 may store the control data Cdata corresponding to, e.g., six channels in response to the sampling pulses SP. For this purpose, the first storage unit 210 includes first storage latches for storing the control data Cdata corresponding to at least one channel of the plurality of channels.

The second storage unit 212 receives the control data Cdata from the first storage unit 210 and stores the received control data Cdata in response to the source output enable signal SOE. The second storage unit 212 supplies the control data Cdata stored therein to the voltage selecting unit 220 positioned in each channel in response to the source output enable signal SOE. For this purpose, the second storage unit 212 includes second storage latches for storing the control data Cdata corresponding to at least one channel of the plurality of channels.

The bias voltage generator 214 generates a plurality of bias voltages. One of the plurality of bias voltages generated by the bias voltage generator 214 is supplied to the operational amplifier 218 via the voltage selecting unit 220.

The DAC 216 is provided in each of the plurality of channels. The DAC 216 selects one of a plurality of gamma voltages supplied by a gamma voltage unit as a data signal in response to the image data RGB.

The operational amplifier 218 is provided in each of the plurality of channels. The operational amplifier 218 transmits the data signal supplied by the DAC 216 to the data line D.

The voltage selecting unit 220 is provided in each of plurality of channels. The voltage selecting unit 220 selects one of the bias voltages generated by the bias voltage generator 214 in response to the control data Cdata, and supplies the selected bias voltage to the operational amplifier 218. For example, when a difference between the previous image data RGBi-1 and the current image data RGBi is large (e.g., when the bit difference between the previous image data RGBi-1 and the current image data RGBi is larger than a preset threshold (e.g., 1 bit)), the voltage selecting unit 220 selects a high bias voltage and supplies the selected high bias voltage to the operational amplifier 218. When the high bias voltage is supplied to the operational amplifier 218, a slew rate may be increased, and thus a voltage corresponding to a desired data signal may shortly be supplied.

In addition, when there is no difference between the previous image data RGBi-1 and the current image data RGBi, the voltage selecting unit 220 selects a low bias voltage and supplies the selected low bias voltage to the operational amplifier 218. When there is no difference between the previous image data RGBi-1 and the current image data RGBi, data signal of the same voltage is supplied to the certain data line D. Therefore, when there is no difference between the previous image data RGBi-1 and the current image data RGBi, the voltage selecting unit 220 selects the low bias voltage, and thus power consumption of a data driver may be minimized. For example, the voltage selecting unit 220 according to an exemplary embodiment of the present invention selects the bias voltage based on the control data Cdata, and thus stable driving of a display panel may be performed and power consumption of the display panel may be minimized.

The switch controller 222 is provided in each of the plurality of channels. The switch controller 222 controls to turn-on or turn-off a switch SW in response to the control data Cdata. For example, when the previous image data RGBi-1 is similar to the current image data RGBi, the switch controller 222 maintains the switch SW in a turn-off state. For example, the previous image data RGBi-1 may be similar to the current image data RGBi when the bit difference between the previous image data RGBi-1 and the current image data RGBi is zero or close to zero within a preset threshold (e.g., 1 bit)).

When the previous image data RGBi-1 is similar to the current image data RGBi, voltages of the data signal supplied to the certain data line D are similar so that the voltages of the certain data line D are maintained and power consumption is minimized.

In addition, when the difference between the previous image data RGBi-1 and the current image data RGBi is large (e.g., when the bit difference between the previous image data RGBi-1 and the current image data RGBi is larger than a preset threshold (e.g., 1 bit), the switch controller 222 turns on the switch SW, and This causes a median voltage of the data signals corresponding to the data lines D1 to Dm to be supplied to each of the data lines D1 to Dm so that power consumption of a data driver may be minimized.

As described above, according to an exemplary embodiment of the present invention, the bias voltage supplied to the operational amplifier 218 and the charge sharing switch SW are controlled based on the control data Cdata to reduce power consumption.

In addition, according to an exemplary embodiment of the present invention, the control data Cdata is generated by using a single data sensing unit 208 commonly connected to a plurality of sampling latches, and thus an area of the data driver 120 may be minimized. For example, when the data sensing unit 208 is provided in each of the plurality of channels, a size of the data sensing unit 208 may increase as the number of bits of the control data increases.

In addition, a partial configuration of the above-described data driver 120a is illustrated. For example, when the data driver 120a is used for a liquid crystal display device (LCD), the DAC 216 may include a positive DAC (PDAC) for generating data signals of positive polarity in response to the polarity control signal POL and a negative DAC (NDAC) for generating data signals of negative polarity in response to the polarity control signal POL.

Figure 4:
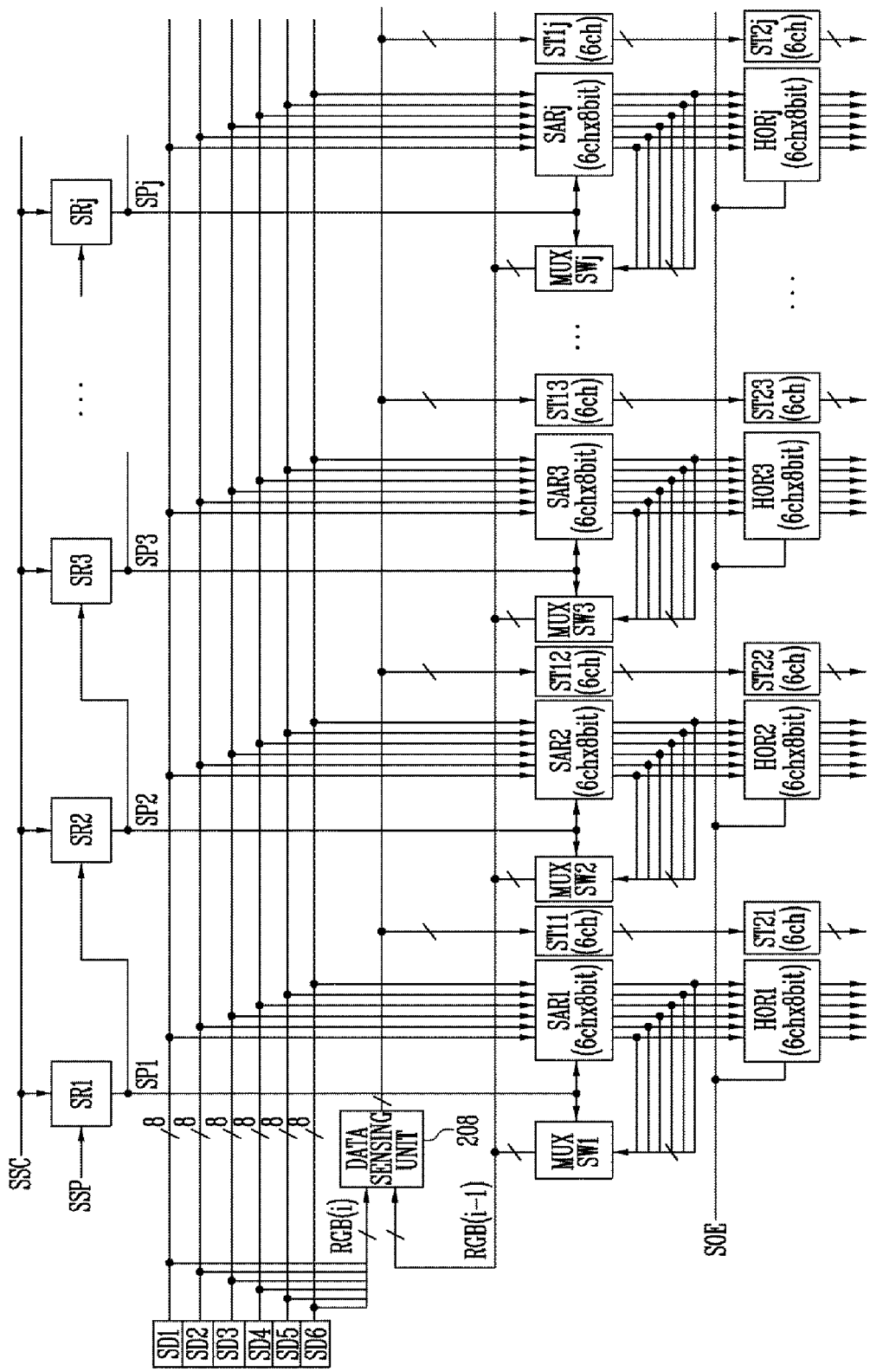
FIG. 4 is a view illustrating a shift register unit, a sampling latch unit, a holding latch unit, a multiplexer unit, and a data sensing unit of FIG. 3 according to an exemplary embodiment of the present invention.

FIG. 4 is a view illustrating a shift register unit, a sampling latch unit 202, a holding latch unit 204, a multiplexer unit 206, and a data sensing unit 208 of FIG. 3 according to an exemplary embodiment of the present invention. In FIG. 4, for ease of description, the image data RGB is assumed to be 8-bit data, and the image data RGB corresponding to, e.g., six channels are simultaneously input to the data sensing unit 208 through data input terminals SD1 to SD6. However, the present inventive concept is not limited thereto.

Referring to FIG. 4, the shift register unit 200 includes shift registers SR1 to SRj (here, j is a natural number). The shift registers SR1 to SRj generate sampling pulses SP1 to SPj, respectively, by shifting the source start pulse SSP in response to the source sampling clock SSC. Here, the shift registers SR1 to SRj output the sampling pulses SP1 to SPj, respectively, in response to a logic high period of the source sampling clock SSC. This will be described in detail later.

Each of the data input terminals SD1 to SD6 receives the image data RGB from the timing controller 130.

The sampling latch unit 202 includes sampling latches SAR1 to SARj. Each of the sampling latches SAR1 to SARj sequentially stores the image data RGB corresponding to, e.g., the six channels in response to a falling edge of each of the sequentially supplied sampling pulses SP1 to SPj.

The holding latch unit 204 includes holding latches HOR1 to HORj.

The holding latches HOR1 to HORj simultaneously receive the image data RGB stored in the sampling latches SAR1 to SARj, and stores the received image data RGB in response to the source output enable signal SOE.

The multiplexer unit 206 includes multiplexer switches MUX SW1 to MUX SWj. Each of the multiplexer switches MUX SW1 to MUX SWj sequentially supplies the image data RGB stored in each of the sampling latches SAR1 to SARj to the data sensing unit 208 in response to a rising edge of each of the sequentially supplied sampling pulses SP1 to SPj. At this time, the image data RGB supplied to each of the sampling latches SAR1 to SARj is supplied to the data sensing unit 208 as the previous image data RGBi-1. In addition, each of the multiplexer switches MUX SW1 to MUX SWj may be formed of a plurality of switches.

The data sensing unit 208 compares the previous image data RGBi-1 supplied by the multiplexer unit 206 with the current image data RGBi supplied by the timing controller 130, and generates the control data Cdata based on the comparison result. For example, the data sensing unit 208 compares the previous image data RGBi-1 corresponding to the six channels with the current image data RGBi corresponding to the six channels, and generates the control data Cdata corresponding to the six channels based on the comparison result.

The first storage unit 210 includes first storage latches ST11 to ST1j. Each of the first storage latches ST11 to ST1j stores the control data Cdata corresponding to, e.g., the six channels supplied by the data sensing unit 208 in response to a falling edge of each of the sequentially supplied sampling pulses SP1 to SPj.

The second storage unit 212 includes second storage latches ST21 to ST2j positioned in each of the plurality of channels. The second storage latches ST21 to ST2j simultaneously receive the control data Cdata from the first storage latches ST11 to ST1j, and store the received control data Cdata in response to the source output enable signal SOE.

Figure 5:
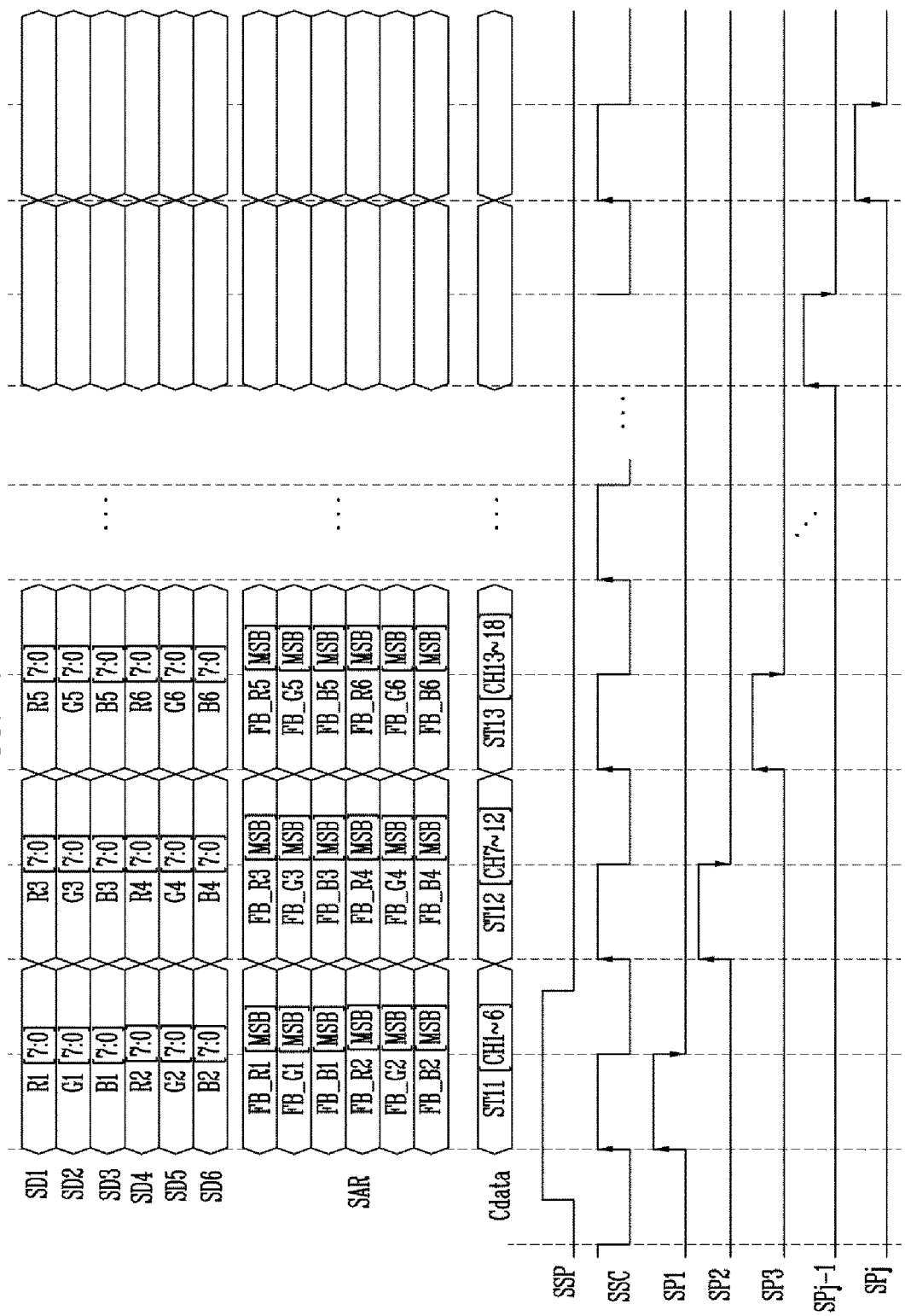
FIGS. 5 and 6 are waveform diagrams illustrating operation processes of the data driver of FIG. 4 according to an exemplary embodiment of the present invention.
Figure 6:
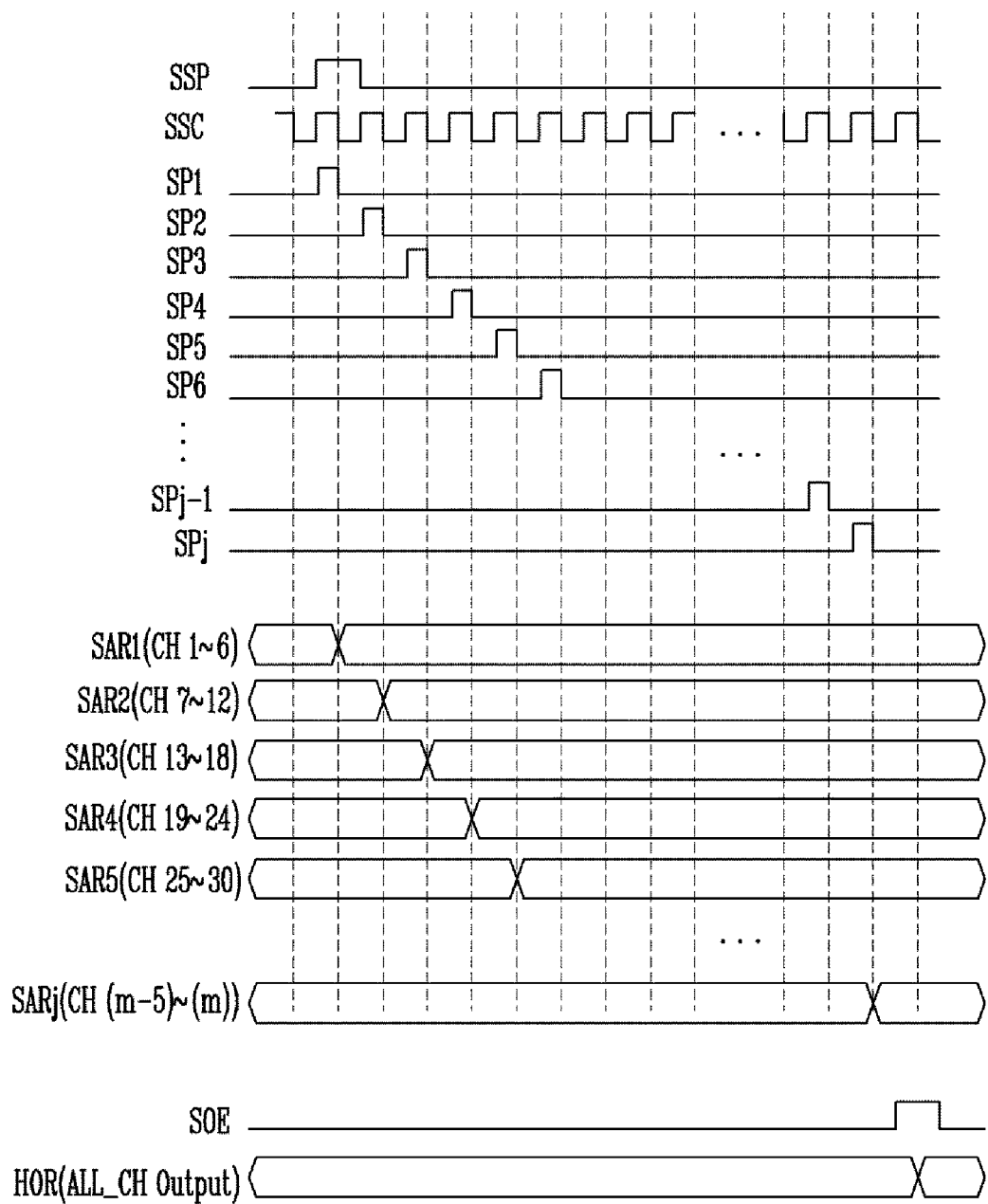

FIGS. 5 and 6 are waveform diagrams illustrating operation processes of the data driver 120a of FIG. 4 according to an exemplary embodiment of the present invention.

Referring to FIGS. 5 and 6, the shift registers SR1 to SRj sequentially generate the sampling pulses SP1 to SPj, respectively, in response to logic high periods of the source sampling pulse SSC.

In a period in which the first sampling pulse SP1 is supplied, image data R1, G1, B1, R2, G2, and B2 to be stored in the first sampling latch SAR1 are respectively input to the data input terminals SD1 to SD6, and are supplied to the data sensing unit 208 as the current image data RGBi.

The first multiplexer switch MUX SW1 is turned on in synchronization with the rising edge of the first sampling pulse SP1. When the first multiplexer switch MUX SW1 is turned on, image data FB_R1, FB_G1, FB_R2, FB_G2, and FB_B2 of six channels that are stored in the first sampling latch SAR1 are supplied to the data sensing unit 208 as the previous image data RGBi-1. Here, each of the image data FB_R1, FB_G1, FB_R2, FB_G2, and FB_B2 supplied as the previous image data RGBi-1 includes at least one bit including the MSB.

The data sensing unit 208 compares the previous image data RGBi-1 (e.g., each of the image data FB_R1, FB_G1, FB_R2, FB_G2, and FB_B2) with the current image data RGBi (e.g., each of the image data R1, G1, B1, R2, G2, and B2), and generates the control data Cdata based on the comparison result. For example, the data sensing unit 208 may determine whether at least one bit including the MSB in each channel, which corresponds to, e.g., each of the image data R1, G1, B1, R2, G2, and B2, changes, and may generate the control data Cdata based on the determination result.

The first sampling latch SAR1 stores the image data R1, G1, B1, R2, G2, and B2, respectively, input through the data input terminals SD1 to SD6 in synchronization with the falling edge of the first sampling pulse SP1. The first storage latch ST11 stores the control data Cdata generated by the data sensing unit 208 in synchronization with the falling edge of the first sampling pulsed SP1.

For example, according to an exemplary embodiment of the present invention, the previous image data RGBi-1 (e.g., the image data FB_R1, FB_G1, FB_R2, FB_G2, and FB_B2) stored in the first sampling latch SAR1 are supplied to the data sensing unit 208 in synchronization with the rising edge of the first sampling pulse SP1. In addition, the data sensing unit 208 compares the previous image data RGBi-1 (e.g., each of the image data FB_R1, FB_G1, FB_R2, FB_G2, and FB_B2) with the current image data RGBi (e.g., each of the image data R1, G1, R2, G2, and B2), respectively, input to the data input terminals SD1 to SD6, and generates the control data Cdata based on the comparison result. The current image data RGBi are stored in the first sampling latch SAR1 in synchronization with the falling edge of the first sampling pulse SP1 and the generated control data Cdata are stored in the first storage latch ST11.

In addition, the current image data RGBi is stored in each of the sampling latches SAR2 to SARj in a similar manner to that in which the current image data RGBi is stored in the sampling latch SAR1, and the control data Cdata are stored in each of the storage latches ST12 to ST1j in response to each of the second to jth sampling pulses SP2 to SPj. For example, as illustrated in FIG. 6, data corresponding to every six channels of a plurality of channels CH1 to CHm (here, m is an integer greater than six) are sequentially stored in each of the sampling latches SAR1 to SARj in response to supply of each of the sampling pulses SP1 to SPj.

After desired image data is stored in the sampling latches SAR1 to SARj, the source output enable signal SOE is supplied.

When the source output enable signal SOE is supplied, each of the holding latches HOR1 to HORj receives the image data stored in each of the sampling latches SAR1 to SARj. In addition, when the source output enable signal SOE is supplied, each of the storage latches ST21 to ST2j receives the control data Cdata stored in each of the storage latches ST11 to ST1j.

Figure 7:
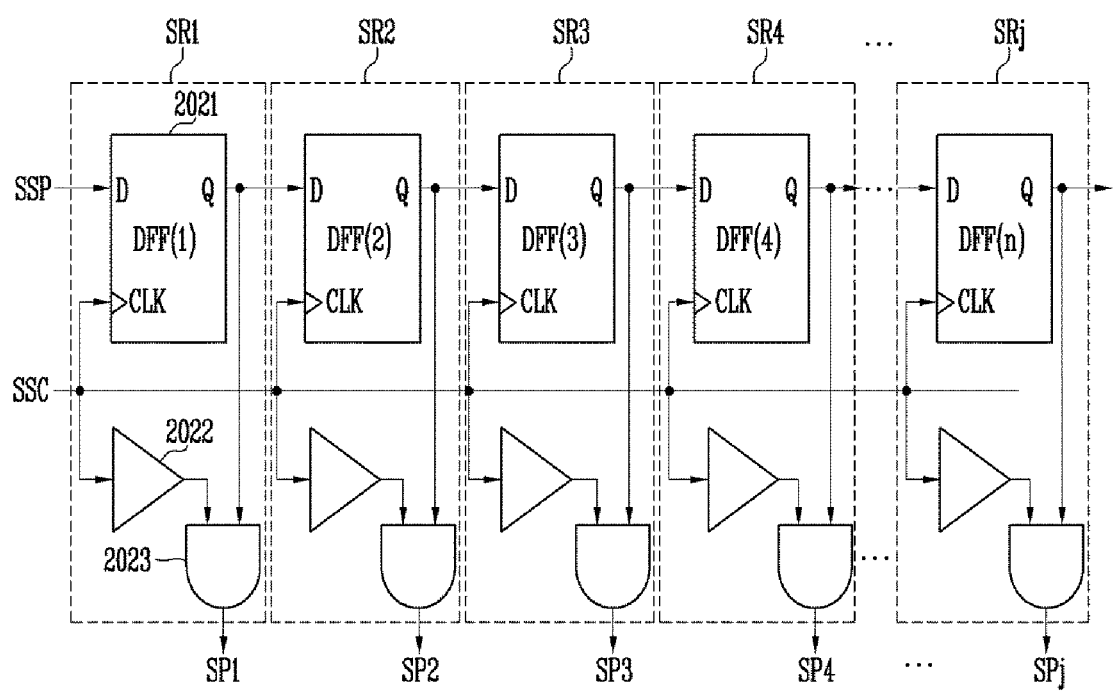
FIG. 7 is a view illustrating the shift register of FIG. 4 according to an exemplary embodiment of the present invention.
Figure 8:
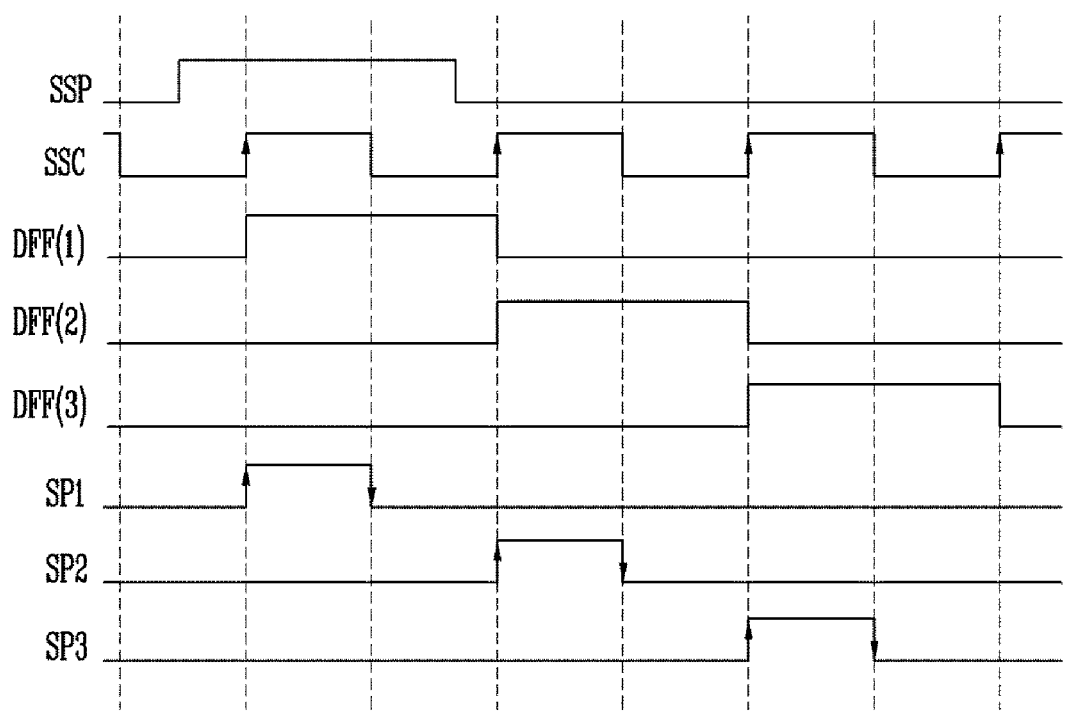
FIG. 8 is a waveform diagram illustrating operation processes of the shift register of FIG. 7 according to an exemplary embodiment of the present invention.

FIG. 7 is a view illustrating the shift register of FIG. 4 according to an exemplary embodiment of the present invention. FIG. 8 is a waveform diagram illustrating operation processes of the shift register of FIG. 7 according to an exemplary embodiment of the present invention.

Referring to FIGS. 7 and 8, each of the shift registers SR1 to SRj includes a D flip-flop 2021, a buffer 2022, and a AND gate 2023.

The D flip-flop 2021 of each of the shift registers SR1 to SRj shifts the source start pulse SSP or previous output signals in synchronization with each of rising edges of the source sampling pulse SSC. For example, the D flip-flop 2021 of the first shift register SR1 shifts the source start pulse SSP in synchronization with a rising edge of the source sampling pulse SSC.

In each of the shift registers SR1 to SRj, the buffer 2021 transmits the source sampling pulse SSC to a first input terminal of the AND gate 2023. In an exemplary embodiment, the buffer 2021 might not be present.

In each of the shift registers SR1 to SRj, the AND gate 2023 performs a logic AND operation on output signals of the D flip-flop 2021 and the source sampling pulse SSC, and supplies waveforms output from the logic AND operations as each of the sampling pulses SP1 to SPj. Then, signals corresponding to high periods of the source sampling pulse SSC are set as the sampling pulses SP1 to SPj.

According to an exemplary embodiment of the present invention, each of the multiplexer switches MUX SW1 to MUX SWj is driven in synchronization with a rising edge of each of the sampling pulses SP1 to SPj, and each of the sampling latches SAR1 to SARj and each of the first storage latches ST11 to ST1j are driven in synchronization with a falling edge of each of the sampling pulses SP1 to SPj.

Therefore, when outputs of the D flip-flops 2021 are used as the sampling pulses SP1 to SPj, a desired operation might not be performed. Therefore, according to an exemplary embodiment of the present invention, the signals corresponding to the high periods of the source sampling pulse SSC are generated as the sampling pulses SP1 to SPj by using the AND gates 2023 so that stability of an operation may be secured.

Figure 9:
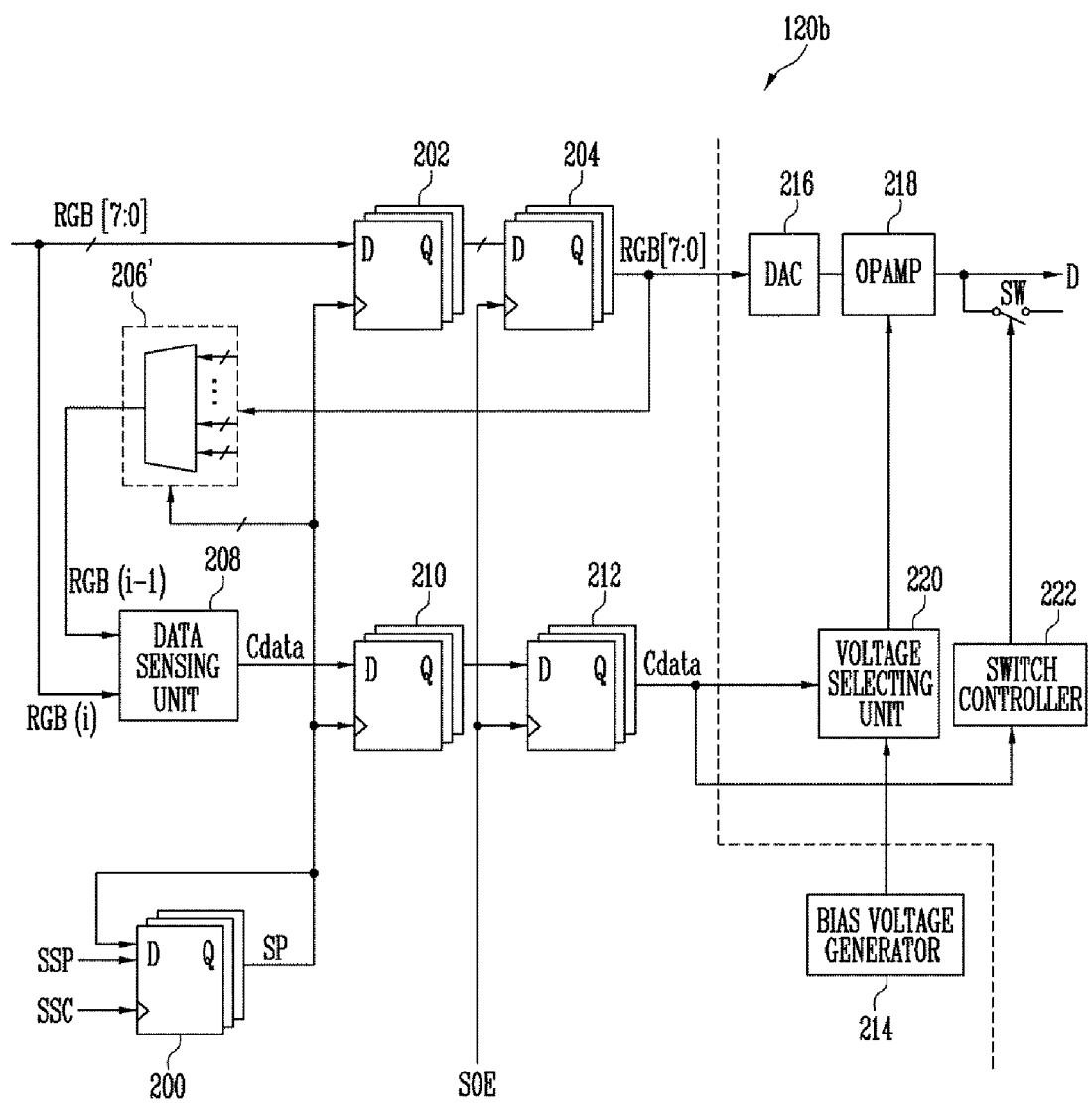
FIG. 9 is a block diagram illustrating a data driver of FIG. 1 according to an exemplary embodiment of the present invention.

FIG. 9 is a view illustrating a data driver 120b of FIG. 1 according to an exemplary embodiment of the present invention. In FIG. 9, the same elements as those of FIG. 3 are denoted by the same reference numerals and thus a detailed description thereof will be omitted.

Referring to FIG. 9, the data driver 120b according to an exemplary embodiment of the present invention includes a shift register unit 200, a sampling latch unit 202, a holding latch unit 204, a first storage unit 210, a second storage unit 212, a multiplexer unit 206', a data sensing unit 208, and a bias voltage generator 214.

In addition, the data driver 120b according to an exemplary embodiment of the present invention includes a DAC 216, an operational amplifier 218, a voltage selecting unit 220, and a switch controller 222 that are disposed in each channel.

The multiplexer unit 206' supplies previous image data RGBi-1 from the holding latch unit 204 to the data sensing unit 208 in response to the sampling pulses SP. For example, operation processes of the data driver 120b of FIG. 9 are substantially the same as those of the data driver 120a of FIG. 3 except that data from the holding latch unit 204 is supplied to the data sensing unit 208 as the previous image data RGBi-1.

Figure 10:
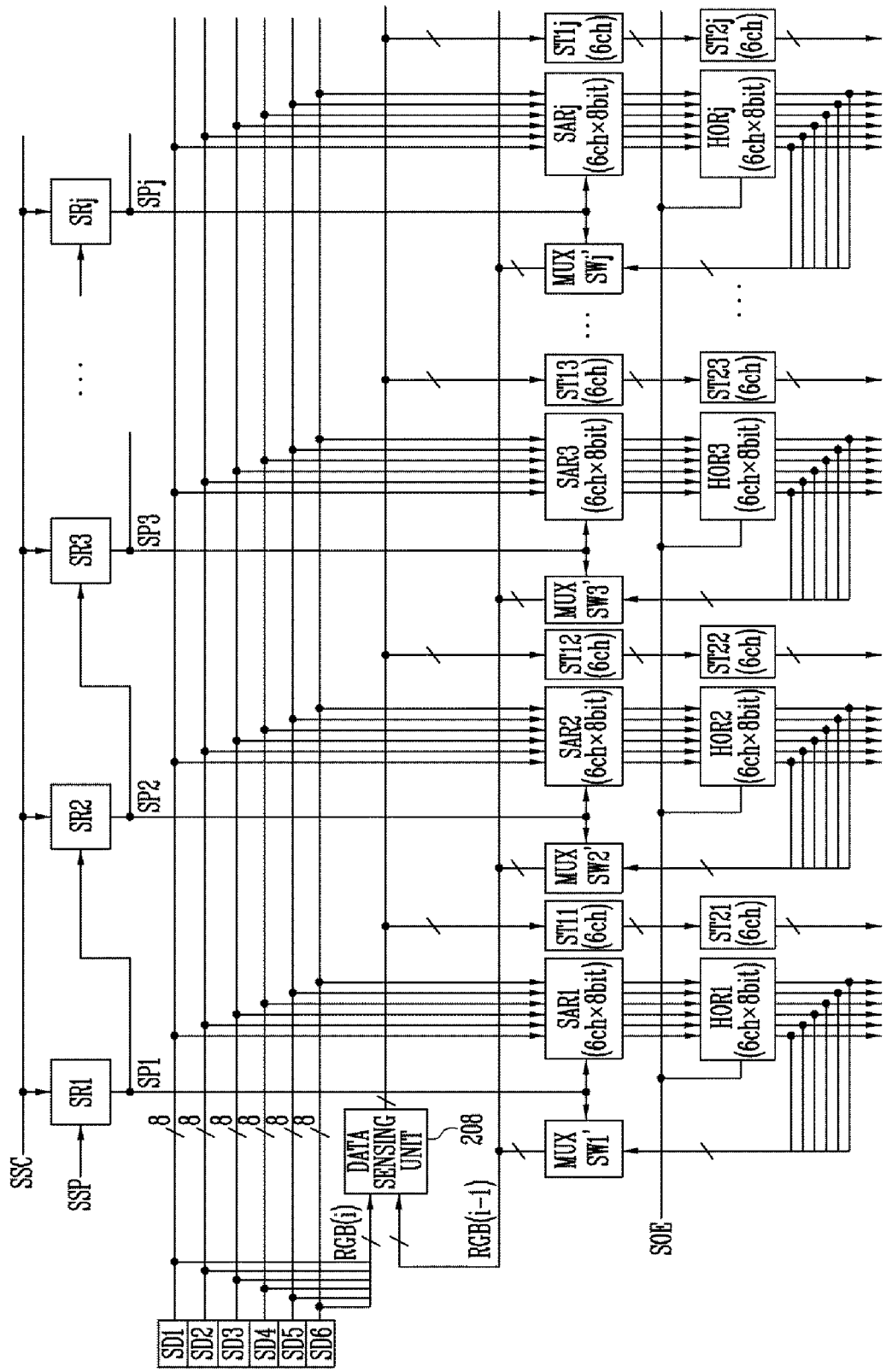
FIG. 10 is a view illustrating a shift register unit, a sampling latch unit, a holding latch unit, a multiplexer unit, and a data sensing unit of FIG. 9 according to an exemplary embodiment of the present invention.

FIG. 10 is a view illustrating a shift register unit 200, a sampling latch unit 202, a holding latch unit 204, a multiplexer unit 206', and a data sensing unit 208 of FIG. 9 according to an exemplary embodiment of the present inventive concept. In FIG. 10, for ease of description, the same elements as those of FIG. 4 are denoted by the same reference numerals and thus a detailed description thereof will be omitted.

Referring to FIG. 10, the multiplexer unit 206' includes multiplexer switches MUX SW1' to MUX SWj' each positioned to correspond to each six channels. Each of the multiplexer switches MUX SW1' to MUX SWj' supplies data stored in each of the holding latches HOR1 to HORj to the data sensing unit 208 as the previous image data RGBi-1 in synchronization with a rising edge of each of the sequentially supplied sampling pulses SP1 to SPj.

For example, after the source output enable signal SOE is supplied, the same data as that stored in the sampling latches SAR1 to SARj is stored in the holding latches HOR1 to HORj. Therefore, the previous image data RGBi-1 supplied from the holding latches HOR1 to HORj to the data sensing unit 208 in synchronization with the rising edges of the sampling pulses SP1 to SPj is set to be the same as the previous image data RGBi-1 supplied from the sampling latches SAR1 to SARj. Operation processes except for the above-described feature are the same as those of FIG. 4 and thus a detailed description thereof will be omitted.

While exemplary embodiments of the present inventive concept have been particularly shown and described, it will be understood that various changes in form and details may be made therein without departing from the spirit and scope of the present inventive concept as defined by the following claims.

What is claimed is:

1. A data driver comprising; a plurality of shift registers configured to sequentially generate a plurality of sampling pulses by shifting a source start pulse in response to a source sampling clock;
   a plurality of sampling latches each configured to receive current data and sequentially store the current data in response to each of the sampling pulses;
   a plurality of holding latches each configured to receive the current data stored in each of the sampling latches, and to store the received current data in response to a source output enable signal;
   a data sensing circuit configured to receive the current data corresponding to an i-th sampling latch of the sampling latches or an i-th holding latch of the holding latches (i is a positive integer) and previous data stored in the i-th sampling latch or the i-th holding latch, to compare the current data with the previous data, and to generate control data based on the comparison result;
   a bias voltage generator configured to generate a plurality of bias voltages;
   at least one digital-to-analog converter (DAC) configured to generate a data signal by using data stored in the holding latches;
   an operational amplifier configured to transmit the data signal to a first data line of a plurality of data lines; and
   a voltage selecting circuit configured to supply one of the plurality of bias voltages to the operational amplifier in response to the control data.

2. The data driver of claim 1, further comprising a plurality of multiplexer switches, each of which is connected to each of the sampling latches and is driven in synchronization with a rising edge of each of the sampling pulses.

3. The data driver of claim 2, wherein an i-th multiplexer switch of the multiplexer switches supplies the previous data stored in the i-th sampling latch or the i-th holding latch in synchronization with a rising edge of an i-th sampling pulse of the sampling pulses to the data sensing circuit.

4. The data driver of claim 1, wherein each of the sampling latches is driven in synchronization with a falling edge of each of the sampling pulses.

5. The data driver of claim 1, wherein the data sensing circuit compares the current data with the previous data by using at least one bit including the most significant bit (MSB) of the current data and the previous data.

6. The data driver of claim 1, further comprising:
   first storage latches configured to sequentially store the control data in synchronization with falling edges of the sampling pulses; and
   second storage latches configured to receive the control data stored in the first storage latches, and to store the received control data in response to the source output enable signal.

7. The data driver of claim 1, further comprising:
   at least one digital-to-analog converter (DAC) configured to generate the data signal by using data stored in the holding latches,
   wherein the operational amplifier is positioned between the DAC and the first data line of the plurality of data lines.

8. The data driver of claim 7, wherein the DAC, the operational amplifier, and the voltage selecting circuit correspond to each of the data lines.

9. The data driver of claim 7, further comprising:
   a plurality of charge sharing switches each connected between each of the data lines and a capacitor; and
   a switch controller configured to control to turn-on and turn-off each of the charge sharing switches in response to the control data.

10. The data driver of claim 1, wherein each of the shift registers comprises:
    a D flip-flop configured to shift a source start pulse or a previous output signal in response to a source sampling pulse; and
    an AND gate configured to perform a logic AND operation on an output signal of the D flip-flop and the source sampling pulse, and to output a waveform obtained by the logic AND operation as the sampling pulse.

11. The data driver of claim 10, wherein each of the shift registers further comprises a buffer configured to transmit the source sampling pulse to the AND gate.

12. A method of driving a data driver, the method comprising:
    generating a plurality of sampling pulses by shifting a source start pulse in response to a source sampling clock;
    storing current data to each of a plurality of sampling latches in response to each of the sampling pulses;
    storing the current data stored in the sampling latches to each of a plurality of holding latches in response to a source output enable signal;
    receiving the current data corresponding to an i-th sampling latch of the sampling latches or an i-th holding latch of the holding latches (i is a positive integer) and previous data stored in the i-th sampling latch or the i-th holding latch;
    comparing the previous data with the current data to generate control data; and
    controlling a bias voltage to be Supplied to an operational amplifier configured to transmit an analog data signal to one of plurality of data lines in response to the control data.

13. The method of claim 12, wherein each of the sampling latches is driven in synchronization with a falling edge of each of the sampling pulses.

14. The method of claim 12, further comprising:
    generating the analog data signal by using data stored in each of the holding latches.

15. The method of claim 14, further comprising controlling turn-on and turn-off charge sharing switches positioned between each of the data lines and a capacitor in response to the control data.

16. A display device comprising;
    a display panel displaying an image; and
    a data driver supplying a plurality of data signals to the display panel through a plurality of data lines,
    wherein the data driver includes a sensing circuit, a sampling latch circuit and a holding latch circuit,
    wherein the sensing circuit compares current image data and previous image data stored in the sampling latch circuit or the holding latch circuit and generates control data based on the comparison result,
wherein a first data line of the plurality of data lines is connected to a first terminal of a first switch, and a second terminal of the first switch is connected to a first capacitor, and wherein a second data line of the plurality of data lines is connected to a first terminal of a second switch, and a second terminal of the second switch is connected to the first capacitor,
wherein the data driver further includes a switch controller controlling to turn-on or turn-off each of the first switch and the second switch based on the control data.

17. The display device of claim 16, wherein the switch controller turns-off each of the first switch and the second switch when the previous image data and the current image data is the same as each other or when a difference between the previous image data and the current image data is smaller than a reference value.

18. The display device of claim 16, wherein the switch controller turns-on each of the first switch and the second switch when a difference between the previous image data and the current image data is larger than a reference value.

\* \* \* \* \*